US008462250B2

(12) United States Patent
Wan et al.

(10) Patent No.: US 8,462,250 B2
(45) Date of Patent: Jun. 11, 2013

(54) IMAGER PIXEL ARCHITECTURE WITH ENHANCED COLUMN DISCHARGE AND METHOD OF OPERATION

(75) Inventors: Chung Chun Wan, Fremont, CA (US); Xiangli Li, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 192 days.

(21) Appl. No.: 13/073,158

(22) Filed: Mar. 28, 2011

(65) Prior Publication Data

US 2012/0188430 A1    Jul. 26, 2012

Related U.S. Application Data

(60) Provisional application No. 61/436,105, filed on Jan. 25, 2011.

(51) Int. Cl.
    *H04N 5/335*    (2011.01)
(52) U.S. Cl.
    USPC .......................................... 348/308; 348/294
(58) Field of Classification Search
    USPC ................................. 348/294–308
    See application file for complete search history.

(56) References Cited

U.S. PATENT DOCUMENTS

| 5,654,537 | A | * | 8/1997 | Prater | 250/208.1 |
| 6,801,256 | B1 | * | 10/2004 | Egawa et al. | 348/294 |
| 7,215,369 | B2 | * | 5/2007 | Beck et al. | 348/308 |
| 7,969,494 | B2 | | 6/2011 | Ladd | |
| 8,288,701 | B2 | * | 10/2012 | Chen et al. | 250/208.1 |
| 2006/0232580 | A1 | * | 10/2006 | Koyama | 345/211 |
| 2008/0291310 | A1 | * | 11/2008 | Ladd et al. | 348/308 |

FOREIGN PATENT DOCUMENTS

| WO | 2008/144478 | 11/2008 |
| WO | WO 2008/144478 A1 | 11/2008 |

* cited by examiner

*Primary Examiner* — Tuan Ho
*Assistant Examiner* — Selam Gebriel

(57) ABSTRACT

A pixel circuit includes a photosensor and a floating diffusion node. A circuit is coupled to the floating diffusion node, for selectively providing a pixel output signal to a column line. A reset circuit, which resets the floating diffusion node, is configured to be activated by the column line. A pullup circuit is included for controlling the reset circuit through a signal on the column line. A discharge circuit, which is separate from the reset circuit, is used for discharging the pixel output signal on the column line. The discharge circuit includes a transistor having a first source/drain terminal coupled to the column line and a second source/drain terminal coupled to a fixed voltage level. The gate of the transistor activates the discharging of the column line.

16 Claims, 10 Drawing Sheets

IMAGER PIXEL ARCHITECTURE WITH ENHANCED COLUMN DISCHARGE AND METHOD OF OPERATION

CROSS REFERENCE TO RELATED APPLICATIONS

This application claims priority to U.S. Provisional Patent Application Ser. No. 61/436,105, filed Jan. 25, 2011, which is incorporated herein by reference in its entirety.

FIELD OF THE INVENTION

Embodiments of the invention relate generally to improved semiconductor imaging devices and in particular to the manner of operating an array of pixels.

BACKGROUND OF THE INVENTION

A conventional four transistor (4T) circuit for a pixel 150 of a CMOS imager is illustrated in FIG. 1. The FIG. 1 pixel 150 is a 4T pixel, where 4T is commonly used in the art to designate use of four transistors to operate the pixel. The 4T pixel 150 has a photosensor such as a photodiode 162, a reset transistor 184, a transfer transistor 190, a source follower transistor 186, and a row select transistor 188. It should be understood that FIG. 1 shows the circuitry for operation of a single pixel 150, and that in practical use, there will be an M×N array of pixels arranged in rows and columns with the pixels of the array accessed using row and column select circuitry, as described in more detail below.

The photodiode 162 converts incident photons to electrons which are selectively passed to a floating diffusion stage node A through transfer transistor 190 when activated by the TX control signal. The source follower transistor 186 has its gate connected to node A and thus amplifies the signal appearing at the floating diffusion node A. When a particular row containing pixel 150 is selected by an activated row select transistor 188, the signal amplified by the source follower transistor 186 is passed on a column line 170 to column readout circuitry. The photodiode 162 accumulates a photo-generated charge in a doped region of the substrate. It should be understood that the pixel 150 may include a photogate or other photon to charge converting device, in lieu of a photodiode, as the initial accumulator for photo-generated charge.

The gate of transfer transistor 190 is coupled to a transfer control signal line 191 for receiving the TX control signal, thereby serving to control the coupling of the photodiode 162 to node A. A voltage source Vpix is coupled through reset transistor 184 and conductive line 163 to node A. The gate of reset transistor 184 is coupled to a reset control line 183 for receiving the Rst control signal to control the reset operation in which the voltage source Vpix is connected to node A.

A row select signal (Row Sel) on a row select control line 160 is used to activate the row select transistor 188. Although not shown, the row select control line 160 used to provide a row select signal (Row Sel) is coupled to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on the column line 170 high. Maintaining a positive voltage on the column line 170 during an image acquisition phase of a pixel 150 keeps the potential in a known state on the column line 170. Signals from the pixel 150 are therefore selectively coupled to a column readout circuit (FIGS. 2-4) through the column line 170 and through a pixel output ("Pix_out") line 177 coupled between the column line 170 and the column readout circuit.

As known in the art, a value can be read from pixel 150 in a two step correlated double sampling process. First, node A is reset by activating the reset transistor 184. The reset signal (e.g., Vpix) found at node A is readout to column line 170 via the source follower transistor 186 and the activated row select transistor 188. During a charge integration period, photodiode 162 produces a charge from incident light. This is also known as the image acquisition period. After the integration period, transfer transistor 190 is activated and the charge from the photodiode 162 is passed through the transfer transistor to node A, where the charge is amplified by source follower transistor 186 and passed to column line 170 through the row select transistor 188. As a result, two different voltage signals—the reset signal and the integrated charge signal—are readout from the pixel 150 and sent on the column line 170 to column readout circuitry where each signal is sampled and held for further processing as known in the art. Typically, all pixels in a row are readout simultaneously onto respective column lines 170 and the column lines may be activated in sequence for pixel reset and signal voltage readout.

FIG. 2 shows an example CMOS imager integrated circuit chip 201 that includes an array 230 of pixels and a controller 232, which provides timing and control signals to enable reading out of signals stored in the pixels in a manner commonly known to those skilled in the art. Exemplary arrays have dimensions of M×N pixels, with the size of the array 230 depending on a particular application. The pixel signals from the array 230 are readout a row at a time using a column parallel readout architecture. The controller 232 selects a particular row of pixels in the array 230 by controlling the operation of row addressing circuit 234 and row drivers 240. Signals corresponding to charges stored in the selected row of pixels and reset signals are provided on the column lines 170 to a column readout circuit 242 in the manner described above. The pixel signal read from each of the columns can be readout sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog to digital converter 248, and sent to an image processor circuit 250 for image processing.

FIG. 3 shows more details of the rows and columns 249 of active pixels 150 in an array 230. Each column includes multiple rows of pixels 150. Signals from the pixels 150 in a particular column can be readout to sample and hold circuitry 261 associated with the column 249 (part of circuit 242) for acquiring the pixel reset and integrated charge signals. Signals stored in the sample and hold circuits 261 can be read sequentially column-by-column to the differential amplifier 246 which subtracts the reset and integrated charge signals and sends them to an analog-to-digital converter (ADC) 248.

FIG. 4 illustrates a portion of the sample and hold circuit 261 of FIG. 3 in greater detail. The sample and hold circuit 261 holds a set of signals, e.g., a reset signal and an integrated charge signal from a desired pixel. For example, a reset signal of a desired pixel on column line 170 is stored on capacitor 228 and the integrated charge signal is stored on capacitor 226.

The operation of the circuits illustrated in FIGS. 1-4 is now described with reference to the simplified signal timing diagram of FIG. 5. During an image acquisition/reset period 290, the pull-up circuit 111 is enabled (via the PULLUP signal) to maintain the column line 170 at a high level and the signal on the row select line 160 is set to a logic low to disable the row select transistor 188 and isolate the pixel 150 from the column line 170.

A readout period 298 for pixel 150 is separated into a readout period 292 for the readout of the reset signal, and a readout period 294 for the readout of the integrated charge signal. To begin the overall readout period 298, the pull-up circuit 111 is disabled to no longer maintain the column line 170 at a high level and the signal on the row select line 160 is set to a logic high to enable the row select transistor 188 and couple the pixel 150 to the column line 170. To begin the reset signal readout period 292, the reset signal RST is enabled placing the reset voltage Vpix on node A which is transferred to the column line 170 via source follower transistor 186 and row select transistor 188 and stored in capacitor 228 when the SHR pulse is applied to switch 220 of the sample and hold circuit 261 (FIG. 4). Thus, reset signal (Vrst) of the desired pixel 150 is sampled and stored on capacitor 228. After the reset signal is stored, the reset readout period 292 ends.

After the reset readout period 292 ends, an integrated charge signal readout period 294 begins. Transfer transistor 190 is enabled by a transfer control signal Tx being pulsed on line 191. The integrated charge which has been integrating at photodiode 162 is transferred onto Node A. Subsequently, the integrated charge signal on node A is transferred onto the column line 170 via source follower transistor 186 and row select transistor 188 and stored in capacitor 226 when an SHS signal is applied to switch 222 of the sample and hold circuit 261 (FIG. 4). The SHS switch 222 (FIG. 4) of the sample and hold circuit 261 is closed thereby storing an integrated charge pixel signal on capacitor 226. The reset and integrated charge signals stored in the sample and hold circuit 261 for the column are now available for the differential readout circuit. The integrated charge signal readout period 294 and the readout period 298 is completed. As part of the next acquisition/reset period 296, the pull-up circuit 111 is enabled to maintain the column line 170 at a high level and the signal on the row select line 160 is set to a logic low to disable the row select transistor 188 and isolate the pixel 150 from the column line 170.

The circuitry described above requires space in an imager. However, there exists a need to reduce the size of imagers, and thus, it is desirable to eliminate circuitry from pixels, which helps reduce size and improves the pixel fill factor by permitting a larger area for the photodiode.

DETAILED DESCRIPTION OF THE INVENTION

In the following detailed description, reference is made to the accompanying drawings, which form a part hereof, and in which is shown by way of illustration specific embodiments. These embodiments are described in sufficient detail to enable those of ordinary skill in the art to make and use them, and it is to be understood that structural, logical, or procedural changes may be made.

The embodiments described herein provide an improved imager and method of operation where the reset transistor is controlled by the signal on the column line. This control arrangement reduces the circuitry required to operate the pixel array of the imager. Dedicated reset control lines and corresponding row drivers are eliminated to reduce the area needed for a pixel and the associated circuitry.

Various imager pixel architectures having a column discharge are described in International Application Number PCT/US2008/063840, titled "Imager and System Utilizing Pixel with Internal Reset Control and Method of Operating Same," which claims priority to U.S. application Ser. No. 11/802,200, filed on May 21, 2007. These applications are incorporated herein by reference in their entireties.

Figure 1:
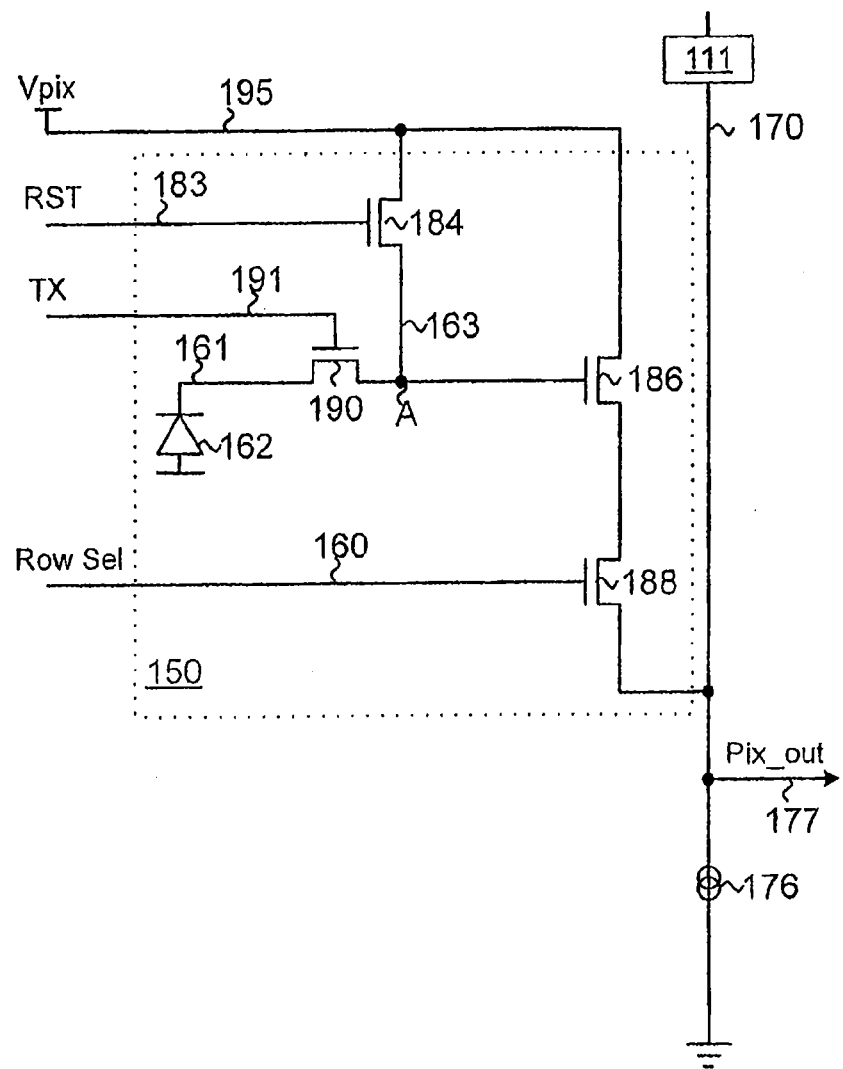
FIG. 1 is an electrical schematic diagram of a conventional imager pixel.
Figure 6A:
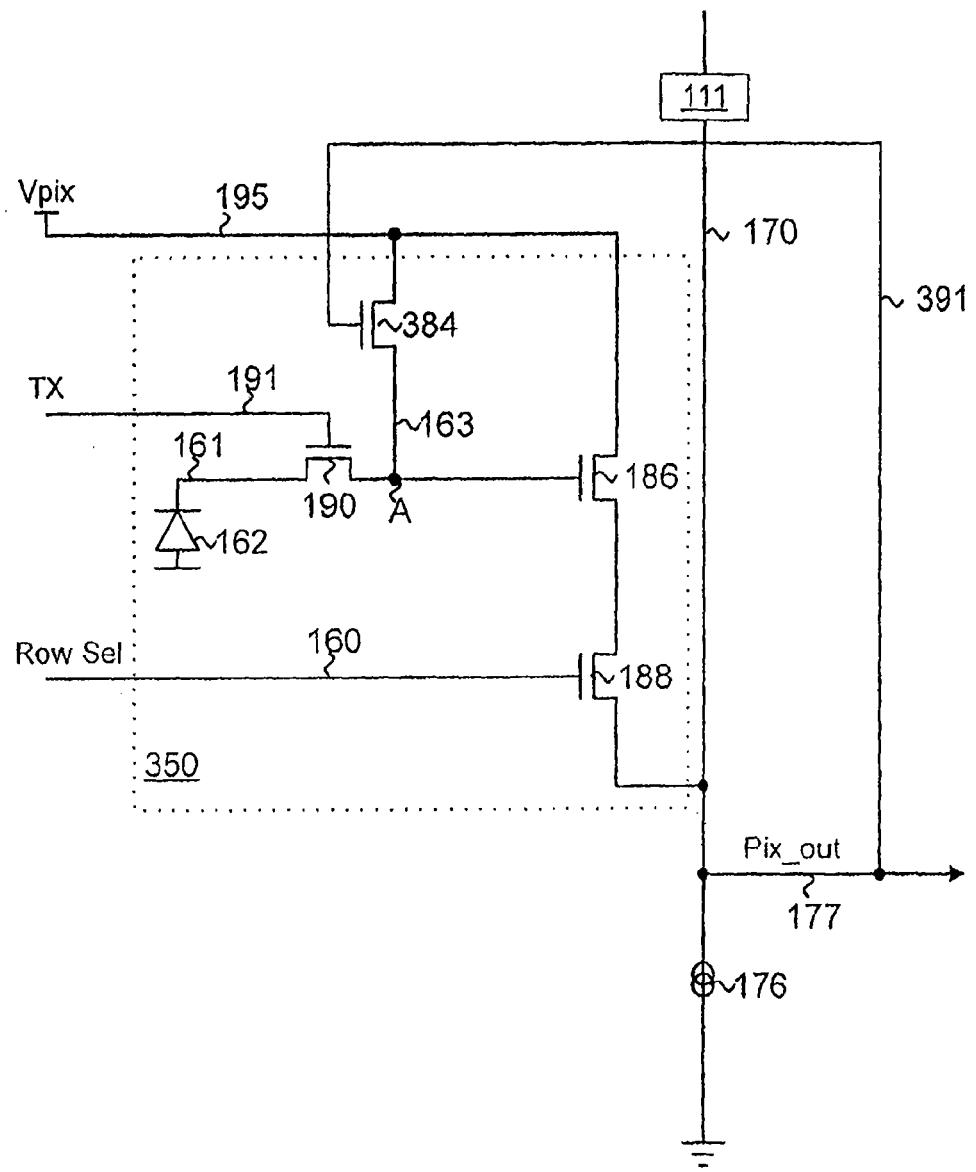
FIG. 6A is an electrical schematic diagram of a pixel circuit where the reset transistor is controlled by a signal on the column line.

According to a first example described in the aforementioned applications, reference is now made to a pixel circuit shown in FIG. 6A. As shown, the gate of the reset transistor 384 is coupled to and controlled by a signal on the column line 170 through a signal on the Pix_out line 177. The pixel 350 is similar to pixel 150 of FIG. 1 except that the gate of the reset transistor 384 is no longer coupled to a reset control line, but instead, the gate of the reset transistor 384 is coupled to the Pix_out line 177 through line 391. The drivers and circuitry required to control and drive the dedicated reset control line 183 (FIG. 1) are eliminated. In FIG. 6A, the signal on the Pix_out line 177 is used to reset the floating diffusion node A, thus maintaining the operation of the 4T pixel. Thus, when the pull-up circuit 111 is enabled and applying a positive voltage to the column line 170, a positive voltage is also applied through the Pix_out line 177 and line 391 to the gate of the reset transistor 384. Applying a positive voltage to the gate of the reset transistor 384 activates the transistor 384 and couples the floating diffusion node A to the voltage source Vpix.

The remaining structures of pixel 350 and their operations correspond to like structures and their operations as described above with respect to FIG. 1.

The threshold of the reset transistor 384 affects the voltage of the floating diffusion node A ($V_{FD}$). If the threshold of reset transistor 384, $V_{rst\_th}$, is zero (0), then subsequent to a reset operation, the voltage of the floating diffusion node A $V_{FD}$, is equal to Vpix. If the reset transistor 384 threshold is not zero, then subsequent to a reset $V_{FD}$ operation, the voltage on node A, $V_{FD}$, is:

$$V_{FD} = Vpix - V_{rs\_th} \quad (1)$$

Figure 7A:
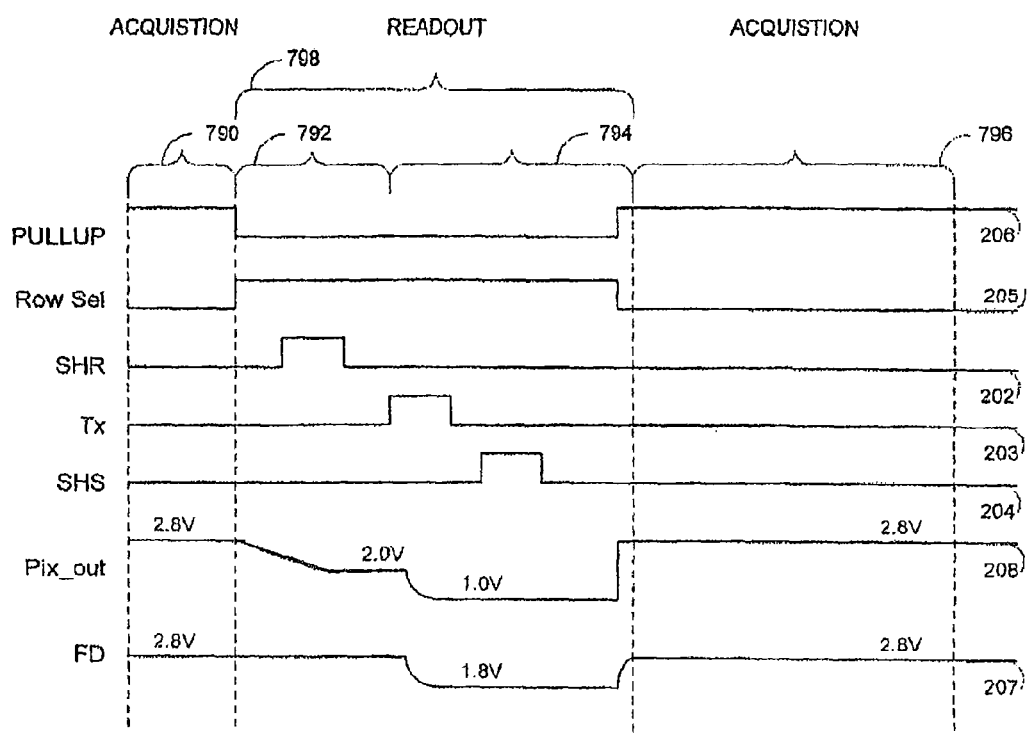
FIG. 7A is a timing diagram associated with the pixel of FIG. 6A.

The operation of the circuit of FIG. 6A is now described with reference to the simplified signal timing diagram of FIG. 7A. The timing diagram is illustrative of the timing of a readout of a pixel from a pixel array, as well as a portion of an acquisition/reset period that precedes and a portion of another acquisition/reset period that follows the readout period. This timing diagram of FIG. 7A is representative of the readout of each of the pixels from a pixel array.

Line 202 represents the SHR signal used to store a reset signal on a sample and hold capacitor for storing the reset signal. When SHR is logic high, switch 220 (FIG. 4) is closed and capacitor 228 is coupled to the column line 170. When SHR is logic low, switch 220 is open and capacitor 228 is uncoupled from the column line 170.

Line 203 (FIG. 7A) represents the Tx control signal at a given time. When the Tx control signal is logic high, Tx transistor 190 (FIG. 6A) is activated and photodiode 162 is coupled to floating diffusion node A. When the Tx control signal is logic low, Tx transistor 190 is open and photodiode 162 is uncoupled from floating diffusion node A. Line 204 (FIG. 7A) represents the SHS signal used to store a integrated charge signal on a sample and hold capacitor for storing integrated charge signals. When SHS is logic high, switch 222 (FIG. 4) is closed and capacitor 226 is coupled to the column line 170. When SHS is logic low, switch 222 is open and capacitor 226 is uncoupled from the column line 170.

Line 205 (FIG. 7A) represents the Row Sel signal at a given time. When the Row Sel signal is logic high, row select transistor 188 (FIG. 6A) is activated and pixel 350 is coupled to the column line 170. When the Row Sel signal is logic low, row select transistor 188 is open and pixel 350 is uncoupled from the column line 170. Line 206 (FIG. 7A) represents the PULLUP signal controlling the pull-up circuit 111 at a given time. When PULLUP is logic high, pull-up circuit 111 (FIG. 6A) is enabled and providing a voltage on column line 170. When PULLUP is logic low, pull-up circuit 111 is disabled and not providing a voltage on column line 170. Line 207 (FIG. 7A) represents the voltage on the Pix_out line 177 (FIG. 6A) at a given time. Line 208 (FIG. 7A) represents the voltage on the floating diffusion (FD) node A (FIG. 6A) at a given time.

During an acquisition/reset period 790, the pull-up circuit 111 is enabled (logic high PULLUP signal) to maintain the column line 170 at a high level and the row select (Row Sel) signal on the row select line 160 is set to a logic low to disable the row select transistor 188 and isolate the source follower transistor 186 from the column line 170. During acquisition/reset period 790, the integrated charge signal is being accumulated by photodiode 162. Also during the acquisition/reset period 790, since the Pix_out line 177 is coupled to the column line 170, the Pix_out line 177 is at a high level, which activates reset transistor 384, thereby coupling floating diffusion node A to the reset voltage Vpix. Assuming that pull-up circuit 111 provides a 2.8V voltage and also assuming that there is no significant loss of voltage in the circuit, then when pull-up circuit 111 is at a high level and therefore Pix_put line 177 is at a high level, the voltage on Pix_out line 177 is equivalent to the voltage provided by the pull-up circuit, 2.8V.

As depicted in FIG. 7A, the voltage on Pix_out line 177 (FIG. 7A, line 208) during the acquisition/reset period 790 is 2.8V. Similarly, when a floating diffusion node A is reset to Vpix, the $V_{FD}$ voltage on node A is 2.8V (FIG. 7A, line 207), assuming no voltage loss in the circuit. In most implementations, the $V_{FD}$ is related to the physical properties of the reset transistor, as indicated above with respect to Eq. (1). Thus, a reset signal is provided to the floating diffusion node A without a dedicated reset line such as the one shown in FIG. 1.

A readout period 798 for pixel 350 is separated into a readout period 792 for the readout of the reset signal, and a readout period 794 for the readout of the integrated charge signal. To begin the overall readout period 798, the pull-up circuit 111 is disabled to no longer maintain the column line 170 at a high level and the Row Sel signal on the line 160 is set to a logic high to enable the row select transistor 188 and couple the pixel 350 to the column line 170.

Figure 4:
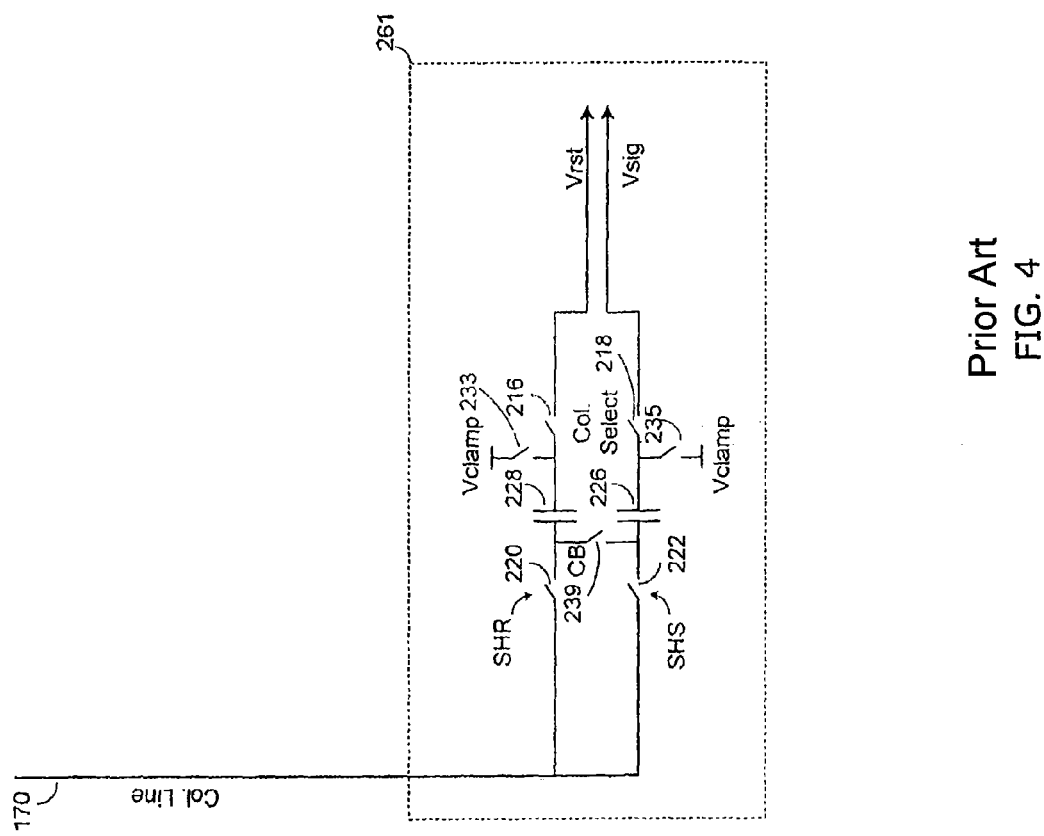
FIG. 4 is a conventional sample and hold circuit.
Figure 5:
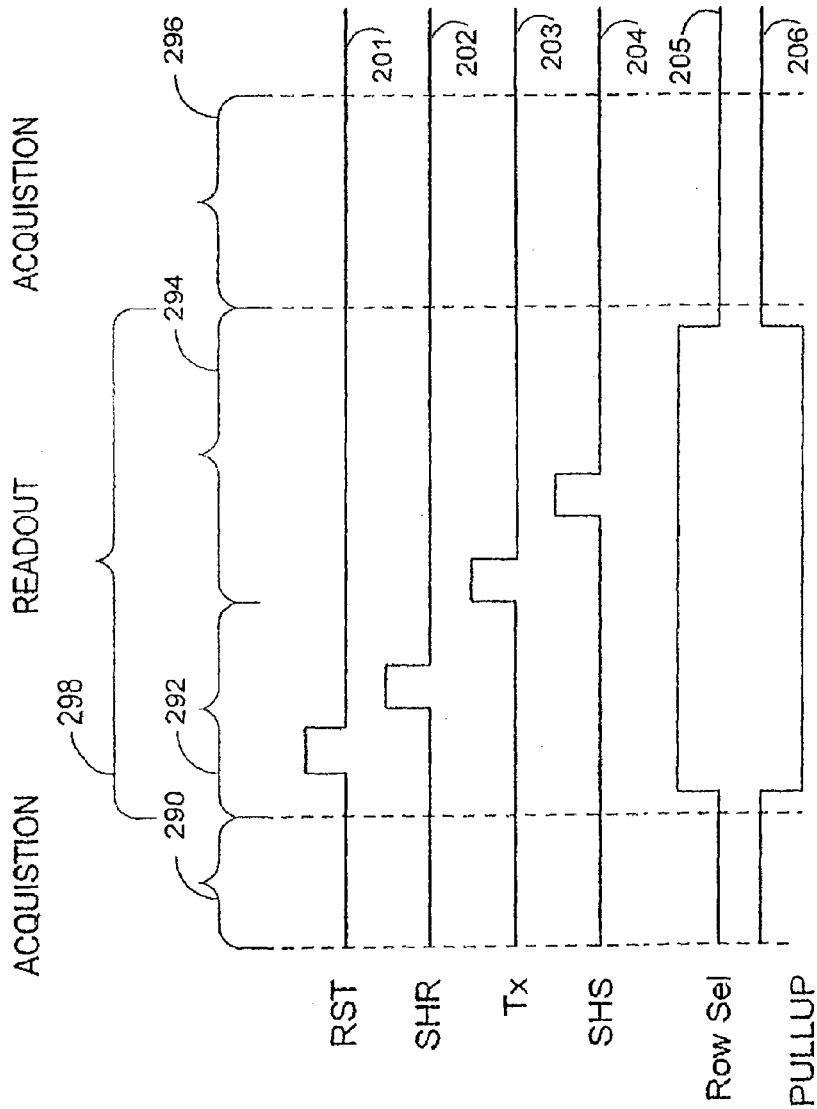
FIG. 5 is a simplified timing diagram associated with operation of the circuitry of FIGS. 1-4.

To begin the reset signal readout period 792, the reset signal on floating diffusion node A is transferred to the column line 170 via source follower transistor 186 and row select transistor 188 and stored in capacitor 228 when the SHR pulse is applied to switch 220 of the readout circuit 242 (FIG. 4). Thus, the reset signal (e.g., Vrst) of the desired pixel 350 is sampled and stored on capacitor 228. After the reset signal is stored, the reset readout period 792 ends.

Figure 2:
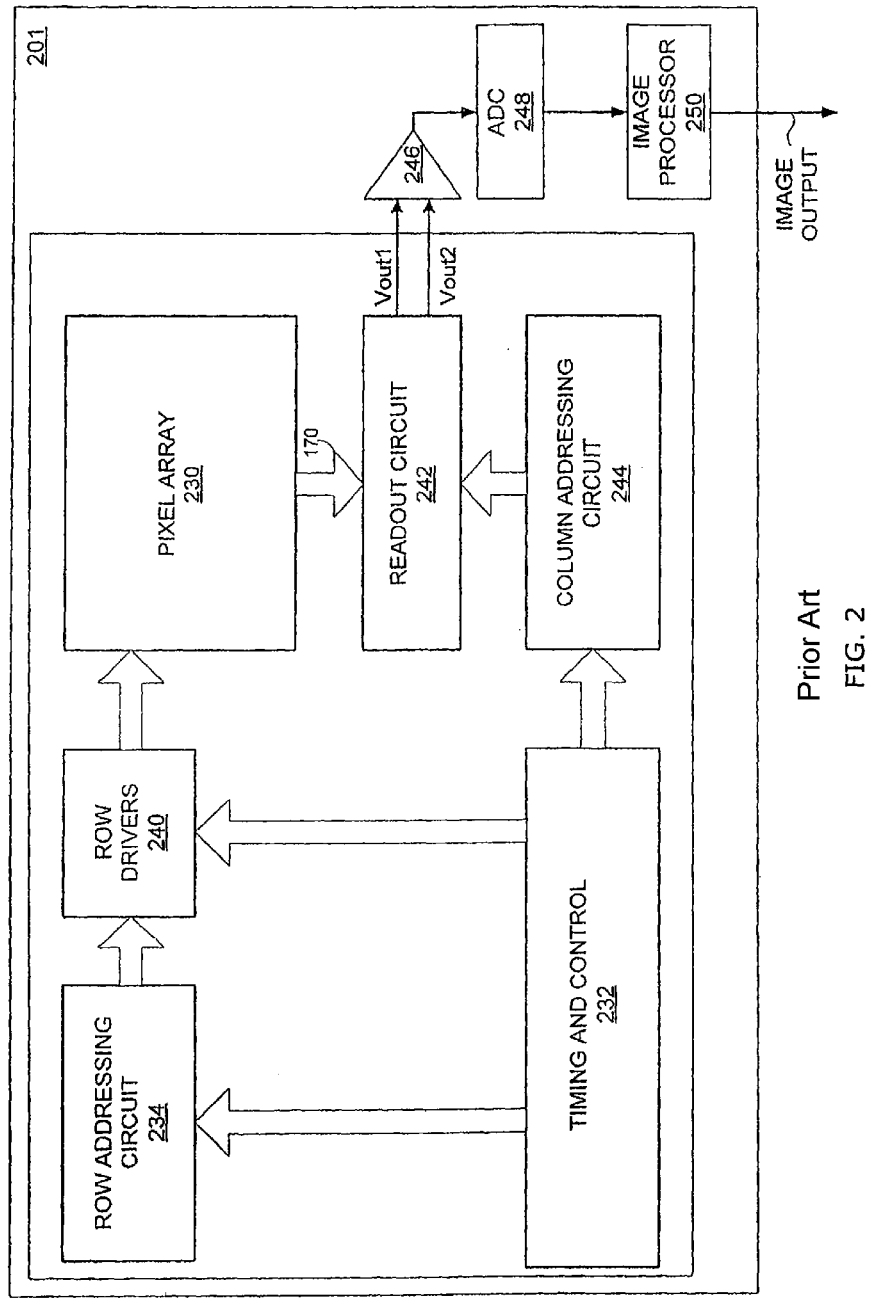
FIG. 2 is a block diagram of a conventional imager chip.
Figure 3:
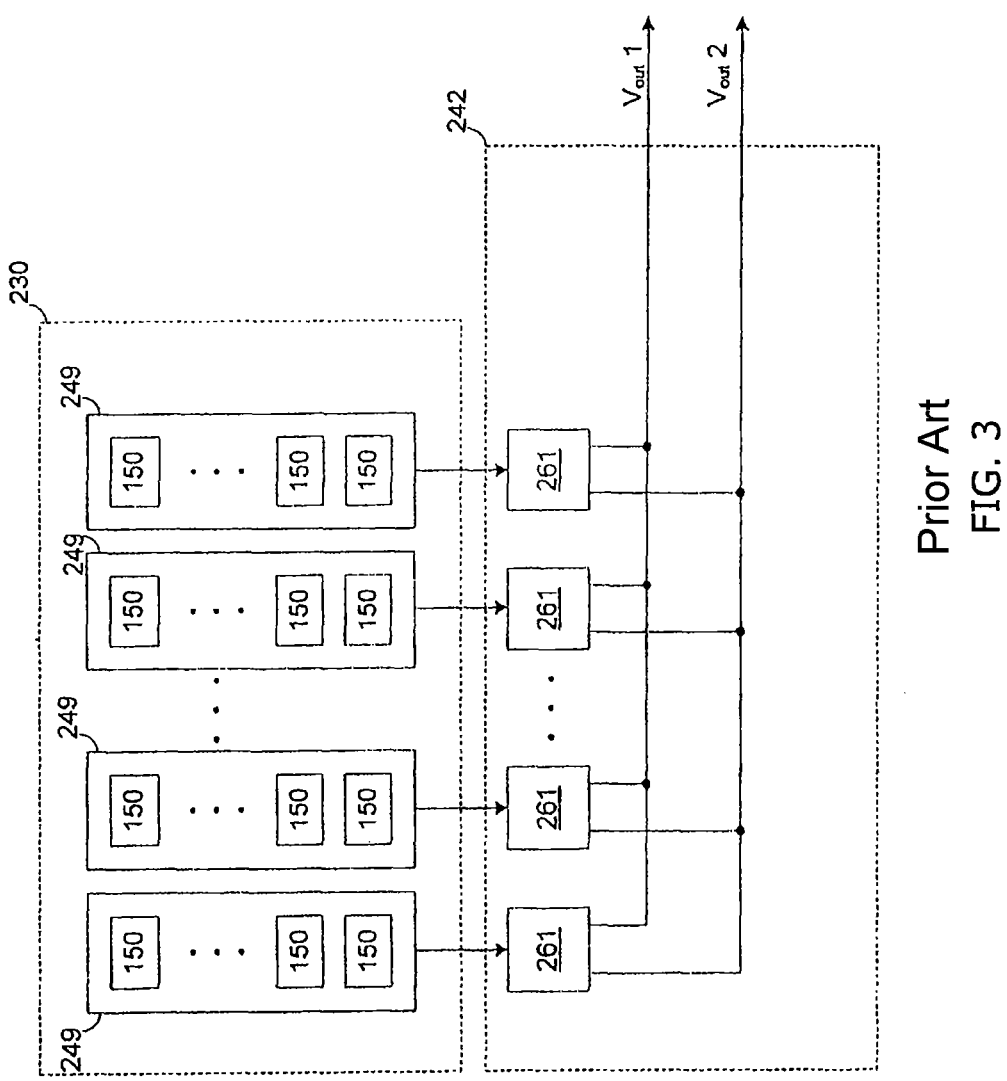
FIG. 3 is a block diagram of an array of pixels illustrated in FIG. 2 and an associated column readout circuit.

After the reset readout period 792 ends, the integrated charge signal readout period 794 begins. Transfer transistor 190 is enabled by a transfer control signal Tx being pulsed on line 191. The integrated charge from photodiode 162 is transferred onto floating diffusion node A. Subsequently, the integrated charge signal on floating diffusion node A is transferred onto the column line 170 via source follower transistor 186 and row select transistor 188 and stored in capacitor 226 when the SHS signal is applied to switch 222 of the column readout circuit 242 (FIG. 4). The SHS switch 222 of the column readout circuit 242 is closed thereby storing an integrated charge pixel signal on capacitor 226. The reset and integrated charge signals stored in the sample and hold circuits 242 for the column are now available for the differential readout circuit 246 (FIG. 2). The integrated charge signal readout period 794 and the readout period 798 is completed.

As depicted in FIG. 7A, the voltage on Pix_out line 177 (FIG. 7A, line 208) and the floating diffusion node A (FIG. 7A, line 207) changes during the readout period 798. During the reset readout period 792, when the Row_sel is enabled the voltage on the Pix_out line 177 decreases due to the threshold voltage on source follower transistor 186. The voltage on the gate of the reset gate 384 is also reduced, which builds a barrier for a potential wall on the floating diffusion node A equivalent to:

$$V_B = V_{SF\_th} \quad (2)$$

If $V_{SF\_th}$=0.8V, then the voltage on the Pix_out line 177 drops to 2.0V.

During the integrated charge signal readout period 794, the voltage on the Pix_out line 177 decreases due to the transferring of the charge from the photodiode 162 to the floating diffusion node A equivalent to $Q/C_{FD}$, where Q is the integrated charge of the photodiode 162 and $C_{FD}$ is the capacitance of the floating diffusion node A. In the example of FIG. 7A, $Q/C_{FD}$=1, thus the voltage on Pix_out line 177 decreases 1.0 V. Correspondingly, the voltage on the Pix_out line and the reset gate 384 is reduced to 1.0V.

With the reduction of the voltage on the Pix_out line 177, the barrier on the potential wall on the floating diffusion node A is $$V_C = V_{SF\_th} + Q/C_{FD} \quad (2),$$

and $V_{FD}$=1.8 V, as depicted in FIG. 7A.

As part of the next acquisition/reset period 796, the pull-up circuit 111 is enabled to maintain the column line 170 at a high level and the signal on the row select line 160 is set to a logic low to disable the row select transistor 188 and isolate the pixel 350 from the column line 170. Although not shown, node A of pixel 350 is reset by reset voltage Vpix during the acquisition/reset period 796 in a similar manner as described above, whereby the pull-up circuit 111 is enabled to maintain the column line 170 at a high level and the signal on the row select line 160 is set to a logic low to disable the row select transistor 188 and isolate the source follower transistor 186 of pixel 350 from the column line 170. Similar to acquisition/ reset period 790, during acquisition period 796 the voltage on node A and on Pix_out line 177 is reset to 2.8V.

Therefore, the pixel can be operated without the need for a dedicated reset line and associated circuitry; in other words, it may have an internal reset operation. This can decrease the size required for the image sensor and corresponding circuitry. While the pixel shown in FIG. 6A has a number of advantages, when compared to a conventional 4-T pixel architecture, it has fundamental limitations. One limitation is its slow readout time which limits its use in high speed applications. The Pix_out line 177 discharges slowly from 2.8V to 2.0V during the reset period of the readout cycle, as shown in signal line 208 in FIG. 7A.

The column Pix_out line is first pulled up to a high voltage (2.8V) to reset the floating diffusion. This is a fast process. The Pix_out line, however, has to subsequently be discharged by a constant current provided by current mirror circuit 176. This is a slow process that limits the readout speed of this imager pixel architecture.

A possible solution to tackle this problem may be to increase the discharging current to speed up the discharge process. One drawback of this approach is that power consumption is increased. The other drawback is that it lowers the SHR value of the pixel, which causes a reduction in full well capacity of the pixel if it is limited by the voltage swing of node A.

Another solution to tackle this problem is an internal reset architecture with enhanced column discharge (IRECD). A first embodiment of an IRECD device, in accordance to the present invention, is shown in FIG. 6B, with its associated timing diagram shown in FIG. 7B.

Figure 6B:
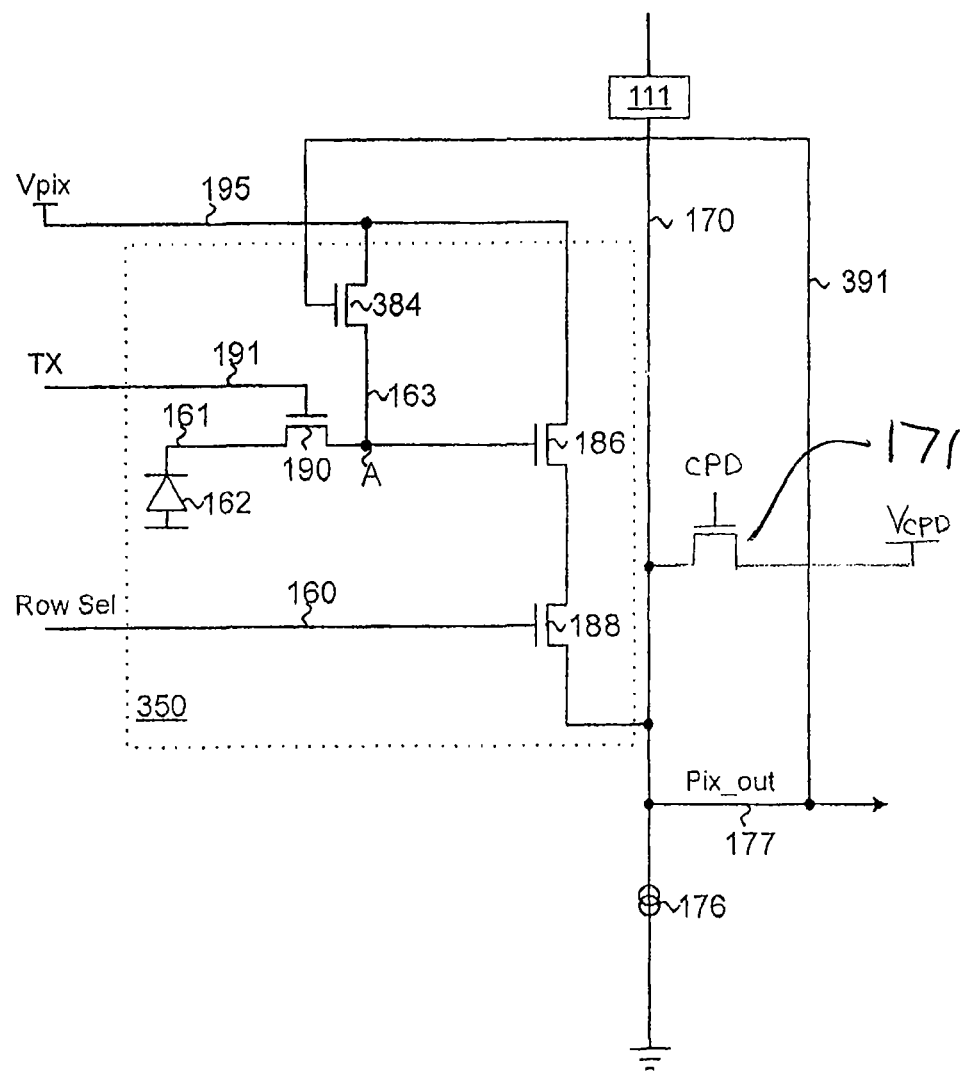
FIG. 6B is an electrical schematic diagram of a pixel circuit similar to the pixel circuit shown in FIG. 6A, except that the pixel circuit includes a pull down transistor, in accordance with an example of the present invention.

As shown in FIG. 6B, an enhanced column discharge (ECD) is provided by the NMOS transistor pull down device, designated as 171. One terminal of transistor 171 is connected to the column Pix_out line 177 (also line 170). The other terminal is connected to a column pull down voltage, $V_{CPD}$. The gate of NMOS transistor 171 is controlled by a column pull down signal, CPD.

In the IRECD device, instead of relying on the constant current provided by a current mirror circuit to discharge the column Pix_out line, the present invention makes use of a constant voltage discharge to discharge the column Pix_out line.

Figure 7B:
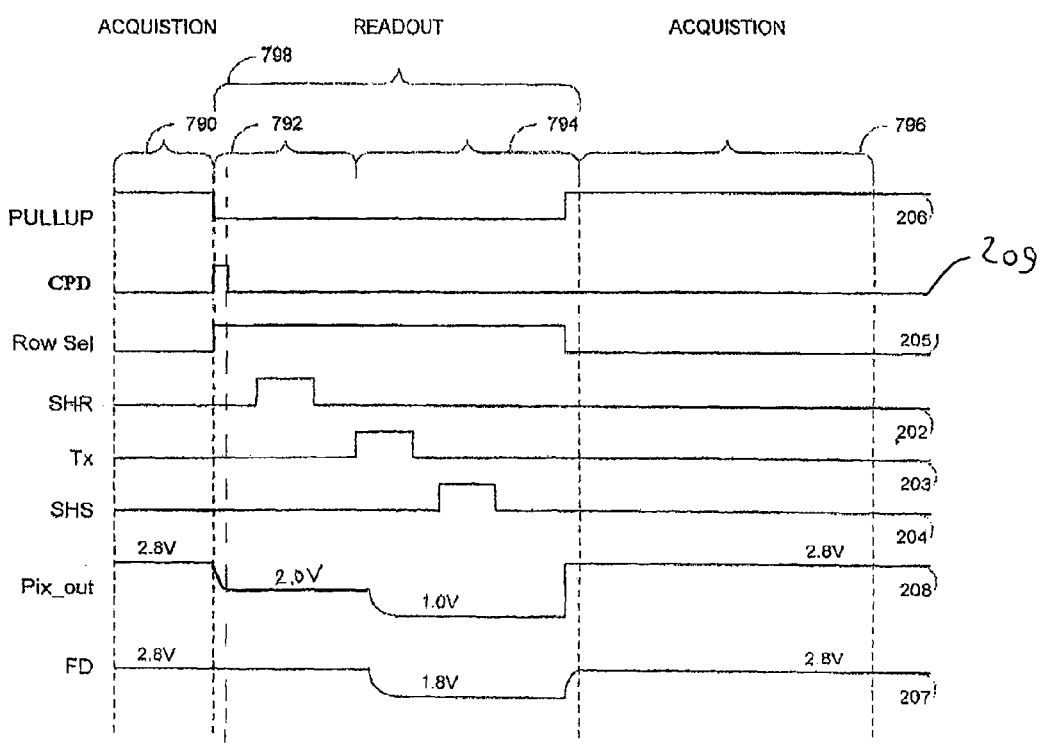
FIG. 7B is a timing diagram associated with the pixel of FIG. 6B, in accordance with an example of the present invention.

Referring now to FIG. 7B, the CPD line, designated as 209, is activated immediately after disabling PULLUP line 206. The CPD command causes a rapid discharge of the Pix_out signal 208. The signal timing shown in FIG. 7B is similar to the timing shown in FIG. 7A, except for the Pix_out signal 208. In comparing FIG. 7B to FIG. 7A, it will be appreciated that transistor 171 very rapidly pulls down the voltage of the Pix_out signal, while absence of transistor 171 allows a much slower current discharge through current mirror 176 of the Pix_out signal.

An important advantage of the IRECD circuit (device) is that the discharge settling time may be made even faster by choosing the appropriate pull down voltage. The present invention allows tuning for the best pixel performance, even after the chip is manufactured. In particular, if the pull down voltage is tuned such that it is close to the final SHR value, the settling time may be made even faster. This is similar to a critically damped circuit in a second-order system.

It will be appreciated that the present invention's use of an NMOS device to quickly bring the column line to its SHR value may also be applied to other imager architecture (e.g. regular 4-T pixel) to enhance their speed performance.

Accordingly, an internal reset of the reset transistor need not be used, but the pull down transistor may, nevertheless, be used to speed up imager performance.

Figure 8:
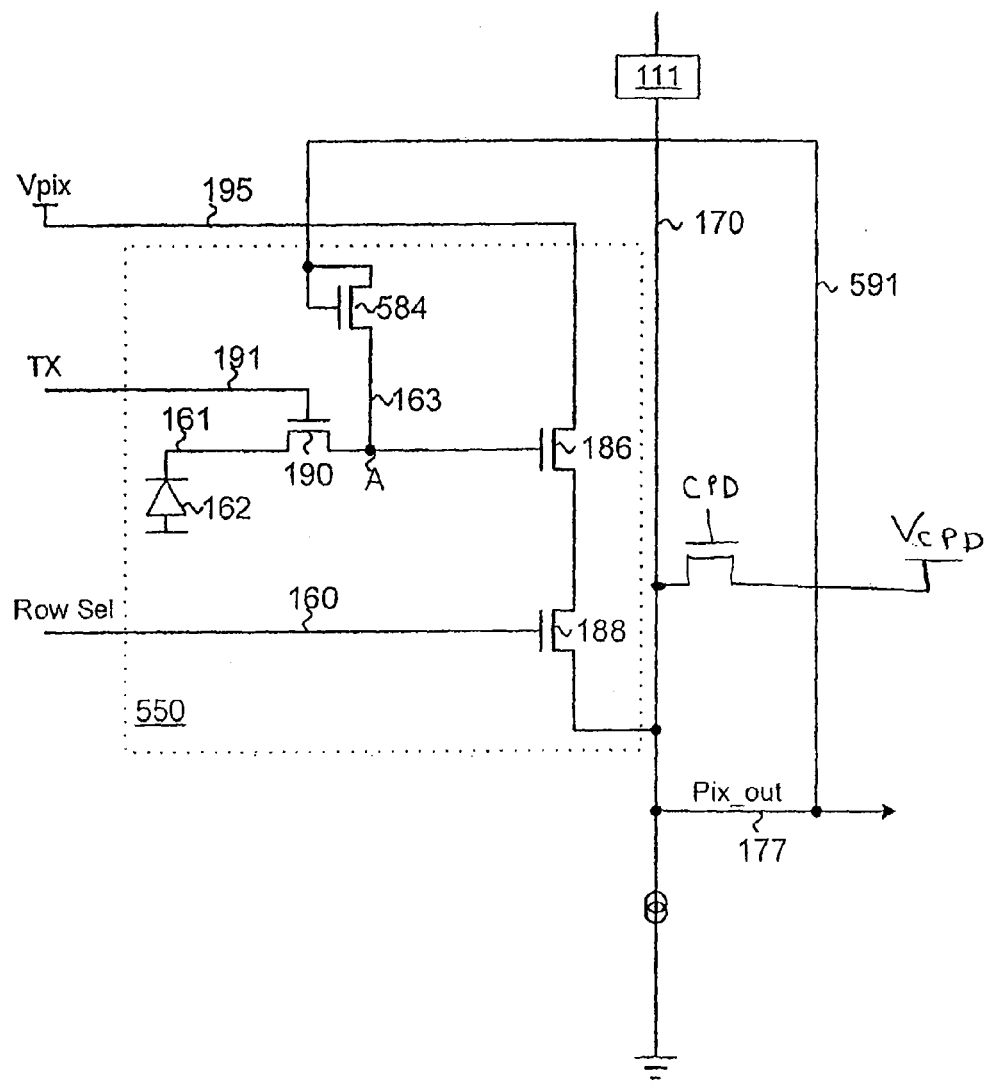
FIG. 8 is an electrical schematic diagram of a pixel circuit, in accordance with another example of the present invention.

FIG. 8 depicts a pixel 550 according to a second embodiment of the present invention. The pixel 550 is similar to pixel 350 of FIG. 6B except that one source/drain of reset transistor 584 is coupled to floating diffusion node A and the other source/drain of reset transistor 584 is coupled to the pull up voltage on the column line 170 through Pix_out line 177, i.e., the other source/drain of reset transistor 584 is coupled to the gate of reset transistor 584. The method of operating the pixel 550 is similar to the method of operating pixel 350 as described above with respect to FIG. 7B, except here the operating voltage for reset transistor 584 is also taken from the voltage on column line 170. The arrangement of having a source/drain of reset transistor 584 coupled to the gate of reset transistor 584 also known as a diode connected transistor.

Although the embodiments described utilize a single pixel, they are not so limited and are also applicable to shared pixel arrays in which more than one photosensor from different pixels are switchably coupled to a common floating diffusion node. Descriptions of shared pixel arrays are provided in PCT/US2008/063840, which is incorporated herein by reference in its entirety.

While the invention has been described and illustrated with reference to specific example embodiments, it should be understood that many modifications and substitutions can be made. Although the embodiments discussed above describe specific numbers of transistors, photodiodes, conductive lines, etc., they are not so limited. Accordingly, the invention is not to be considered as limited by the foregoing description but is only limited by the scope of the claims.

What is claimed:

1. A pixel circuit comprising:
a photosensor;
a floating diffusion node;
a circuit, coupled to the floating diffusion node, for selectively providing a pixel output signal to a column line;
a reset circuit for resetting the floating diffusion node, the reset circuit configured to be activated by the column line;
a pullup circuit for charging the pixel output signal on the column line; and
a discharge circuit, separate from the reset circuit, for discharging the pixel output signal on the column line, wherein the discharge circuit includes a transistor having a first source/drain terminal coupled to the column line and a second source/drain terminal coupled to a predetermined voltage level and wherein the predetermined voltage level is based on a voltage discharge level obtained during a reset phase of the pixel output signal.

2. The pixel circuit of claim 1 wherein the transistor includes a gate terminal for activating the discharge circuit and discharging the pixel output signal on the column line.

3. The pixel circuit of claim 1 wherein the pullup circuit is activated, during an acquisition phase, in which the floating diffusion node is reset.

4. The pixel circuit of claim 1 wherein the pullup circuit is deactivated, during a readout phase, in which the pixel output signal is provided to a sample and hold circuit.

5. The pixel circuit of claim 1 wherein the reset circuit includes a source/drain terminal coupled to the floating diffusion node, and a gate terminal connected to the column line.

6. The pixel circuit of claim 1 wherein the reset circuit includes a first source/drain terminal coupled to the floating diffusion node, and both a second source/drain terminal and a gate terminal connected to the column line.

7. An imager comprising:
a pixel array including:
  a plurality of pixels, each pixel including
    a photosensor and a floating diffusion node;
    a circuit, coupled to the floating diffusion node, for selectively providing a pixel output signal to a column line;
    a reset circuit for resetting the floating diffusion node, the reset circuit configured to be activated by the column line; and
    a discharge circuit, connected to the column line, for discharging the pixel output signal on the column line, wherein the discharge circuit includes a transistor having a first source/drain terminal coupled to the column line and a second source/drain terminal coupled to a set voltage level; and
  a pullup circuit for charging the pixel output signal on the column line.

8. The pixel circuit of claim 7 wherein the transistor includes a gate terminal for activating the discharge circuit and discharging the pixel output signal on the column line.

9. The imager of claim 7 wherein each pixel includes:
a reset circuit, separate from the pullup circuit, for resetting the floating diffusion node, the reset circuit configured to be activated by the column line.

10. A method of operating a pixel, wherein the pixel includes a column line and a reset transistor, the method comprising the steps of:
  performing a reset of the pixel by applying a voltage on the column line through a pullup circuit, in which the column line is connected to the reset transistor, and
  performing a discharge of the column line, wherein performing the discharge includes applying a pulse to a gate terminal of a column pull down transistor, in which a first source/drain terminal of the column pull down transistor is connected to the column line and a second source/drain terminal of the column pull down transistor is connected to a set voltage level.

11. The method of claim 10 wherein the reset is performed during an acquisition phase of operation.

12. The method of claim 10 wherein performing the reset includes applying a pull up voltage to the column line.

13. The method of claim 12 wherein performing the reset includes applying the pull up voltage to a gate terminal of the reset transistor.

14. The method of claim 13 wherein the reset transistor includes a source/drain terminal connected to a floating diffusion node.

15. The method of claim 13 wherein the reset transistor includes a first source/drain terminal connected to a floating diffusion node, and a second source/drain terminal connected to the gate terminal.

16. The method of claim 10 wherein performing the discharge includes discharging a high voltage level on the column line to a tuned voltage level, during a reset readout period, in which the tuned voltage level is lower than the high voltage level.

* * * * *